United States Patent [19]

Takemoto et al.

[11] Patent Number: 4,484,211
[45] Date of Patent: Nov. 20, 1984

[54] OXIDE WALLED EMITTER

[75] Inventors: Toyoki Takemoto, Kyoto; Tsutomu Fujita, Osaka; Hiroyuki Sakai, Osaka; Haruyasu Yamada, Osaka, all of Japan

[73] Assignee: Matsushita Electric Industrial Co., Ltd., Osaka, Japan

[21] Appl. No.: 542,555

[22] Filed: Oct. 17, 1983

Related U.S. Application Data

[63] Continuation of Ser. No. 231,460, Feb. 4, 1981, abandoned.

[51] Int. Cl.³ .................. H01L 27/04; H01L 29/04; H01L 29/72
[52] U.S. Cl. .......................... 357/50; 357/34; 357/55; 357/59; 357/20
[58] Field of Search ............... 357/50, 55, 89, 34, 357/20

[56] References Cited

U.S. PATENT DOCUMENTS

| 4,160,991 | 7/1979 | Anantha et al. | 357/50 |
| 4,214,315 | 7/1980 | Anantha et al. | 357/50 |
| 4,231,819 | 11/1980 | Raffel et al. | 357/50 |
| 4,255,207 | 3/1981 | Nicolay et al. | 357/55 |
| 4,269,636 | 5/1981 | Rivoli et al. | 357/55 |
| 4,318,751 | 3/1982 | Horng | 357/50 |

OTHER PUBLICATIONS

Cosand, "Very High Speed . . . Bipolar . . . ", IEEE International Electron Dev. Meeting, Technical Digest, Dec. 1973, pp. 35-37.

Primary Examiner—William D. Larkins
Assistant Examiner—Charles S. Small, Jr.
Attorney, Agent, or Firm—Burgess, Ryan and Wayne

[57] ABSTRACT

A semiconductor integrated circuit device in which the side surfaces of an emitter of an oxide isolated bipolar transistor are surrounded with insulating compounds or regions so that the capacitance between the emitter and base is lowered and a base is formed by the self-alignment so that the influence of an active base between an external base and the emitter can be made negligible. Thus the base resistance and parasitic capacitance are lowered.

7 Claims, 21 Drawing Figures

OXIDE WALLED EMITTER

This application is a continuation of application Ser. No. 231,460, filed 2/4/81 now abandoned.

BACKGROUND OF THE INVENTION

The present invention relates to a semiconductor integrated circuit device and a process for fabricating the same and more particularly a bipolar semiconductor device having excellent high-frequency response and a process for fabricating the same.

As compared with the MOS semiconductor devices, the bipolar semiconductor devices are faster in operation but have the problems that the integration density is low and the power consumption is high. Without solving these problems, a further development of bipolar semiconductor devices would be impossible.

In the earlier stage of MOS semiconductor devices, there were the advantages in that the isolation between elements is not needed because MOS elements utilizes the inversion layers or channels in a wafer and that, as is clear from the silicon- or molybdenum-gate elements, the self-alignments can be utilized in forming the drains, sources and channels because the gate can be used as a mask for forming the source and drain. However, as the integration density is increased, the isolation between the elements; that is, the isolation of the drain and source of one element from those of adjacent elements are required. Thus the isolation problem must be solved for a further development of MOS semiconductor devices.

Meanwhile, in the bipolar semiconductor devices in the early stage, the epitaxial layers were very thin and of the order of 10 µm and very wide isolation spaces were available for isolation. Since then the isolation technology has made a great advance now, the most thin epitaxial layer or film is two µm in thickness. In addition, a wide isolation distance is not needed and the base and collector regions can be formed so as to be in contact with the isolation regions. Thus as far as the isolation problem is concerned, no distinct difference exists between the processes for fabricating the MOS and bipolar semiconductor devices. However, in the fabrication of bipolar semiconductor devices, a technique for self-aligning bases, emitters and collectors has not been available. As a result, the degree of shrinkage of bipolar semiconductor devices is by far lower than that of MOS semiconductor devices.

Another problem is encountered in the fabrication of bipolar semiconductor devices. In order to lower the base resistance, the graft bases (highly doped bases) must be formed as an external base region. When the impurities between the graft and active base regions are high in concentration and if the emitter and graft base regions are made into contact with each other, the degradation of breakdown voltage, burst noise and leakage current will result.

Thus as compared with the three regions of drain, channel and source of MOS elements, a bipolar element has four regions of emitter, collector, base and graft base so that the space for each element is greater.

SUMMARY OF THE INVENTION

The present invention was made to overcome the above and other problems encountered in the prior art bipolar semiconductor devices and has for its object to provide a high-density semiconductor device with a higher degree of frequency response and a process for fabricating the same. Especially the present invention has for its object to provide a bipolar semiconductor device in which the side surfaces of the emitter region are surrounded or covered with insulating or isolation regions and the self-alignment can be used when the base regions are formed so that the base resistance and parasitic capacitance are considerably lowered. The present invention also provides a process for fabricating such bipolar semiconductor device as described above.

The effects, features and advantages of the present invention may be summarized as follows.

(1) The emitter, base and collector contacts can be self-aligned with their respective impurity layers. In addition, the isolation regions or films for isolating between the base and emitter and between the base and emitter can be formed shallower in depth than the isolation regions or films between the elements. As a result, the lateral extensions of the isolation regions can be minimized and subsequently a higher degree of integration density can be attained in a relatively simple manner.

(2) The graft base region or the external base region can be self-aligned to the emitter region in such a way that the external base region may be extended to the area immediately below one edge or side of the emitter region so that the base resistance can be lowered. In addition, the graft base region is formed after the emitter region, the active base region and the oxide regions or films have been formed. As a result, a heat-treatment at high temperatures and an oxidation step can be eliminated and consequently the distribution profile of impurities can be kept almost unchanged. Furthermore, the penetration of impurities at a high concentration into the active base region immediately below the emitter region can be suppressed completely. Thus, the degradation of breakdown voltage between the emitter and base can be avoided and the generation of low frequency noise can be suppressed.

(3) The side surfaces of the emitter and collector regions and at least one side surface of the base regions are surrounded with the isolation regions, so that the parasitic capacitance can be lowered to a minimum degree. As a result, high frequency response can be improved remarkably.

(4) The bipolar semiconductor devices having the above described features; that is, a higher degree of density resulting from the self-alignment of contacts and the faster operations resulting from the reduction in both the base resistance and parsitic capacitance can be fabricated by a simple process.

BRIEF DESCRIPTION OF THE DRAWINGS

Same reference numerals are used to designate similar parts throughout the figures.

DETAILED DESCRIPTION OF THE PRIOR ART

Figure 1:
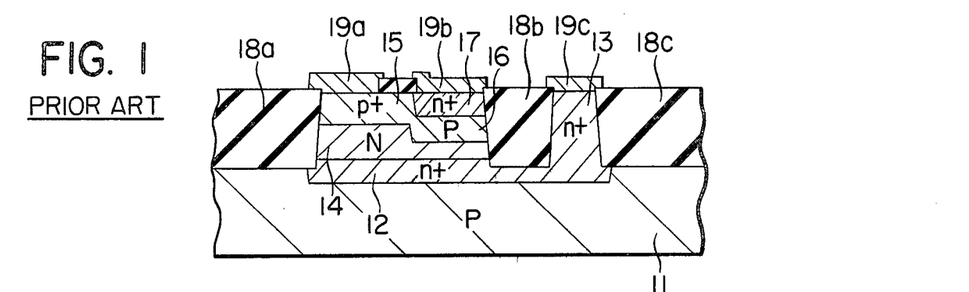
FIGS. 1, 2 and 3 show sectional views of the prior art bipolar semiconductor devices respectively.

In FIG. 1 is shown a bipolar semiconductor device which is called OXIM (Oxide Isolated Monolithic). Reference numeral 11 denotes a P-type semiconductor substrate or wafer; 12, an n+-type implanted area; 13, an n+-type area or a collector contact area; 14, an N collector area; 15, a p+-type external base area; that is a graft area; 16, a P-type active base area; 17, an n+-type emitter area; 18a, 18b and 18c, isolation areas; and 19a, 19b and 19c, base, emitter and collector electrodes, respectively. The isolation area 18b, which is an insulator of SiO$_2$, is formed together with the isolation areas 18a and 18c in order to isolate the elements. Even though the isolation area 18b which is formed between the collector area 14 and the emitter area 17 so as to isolate them from each other, is thin but is deep. As a result, there arises the problem that the isolation region 18b has a wider width and subsequently occupies a large area.

In order to drop the base resistance, the graft base region 15 is provided. Thus the semiconductor device has improved characteristics. However, the graft base region 15, which is p+-type and the emitter region 17 which is n+-type are made into contact with each other so that fundamental defects such as leakage current, noise generation, degradation in breakdown voltage and so on result.

In order to overcome these defects, the graft base region 15 and the emitter region or area 17 must be separated from each other. As a result, a yet another photolithographic step is needed. Then errors in mask registration or alignment must be taken into account, so that the increase in surface area of an element cannot be avoided.

Figure 2:
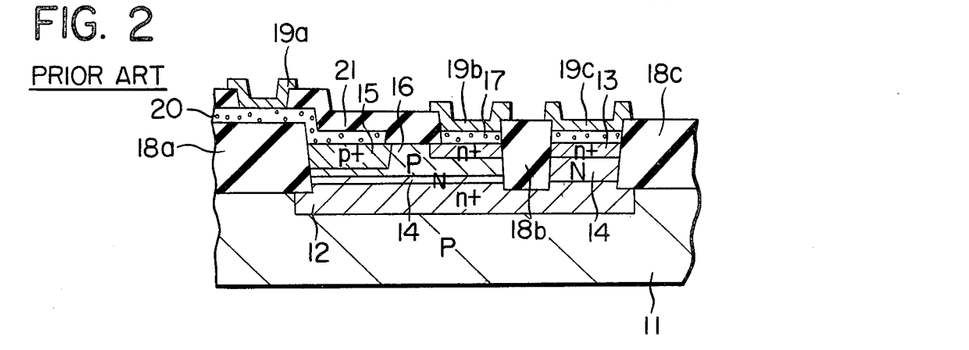

In FIG. 2 is shown a bipolar transistor which has been so designed and constructed as to overcome the above-described problems. In addition to the areas, regions and electrodes described with reference to FIG. 1, the semiconductor device shown in FIG. 2 further includes a polysilicon layer 20 and an oxide layer 21. The graft base region 15 is separated from the emitter region 17, so that the problems resulting from the contact between the graft base region 15 and the emitter region 17 as shown in FIG. 1 have been overcome. If the surface of the graft base region 15 were metallized directly, the alignment tolerance of a mask for patterning a contact window would have to be increased. Therefore, the graft base region 15 is formed by diffusion through the polysilicon layer 20. In addition, the polysilicon layer 20 is extended beyond the graft base region 15 so as to be connected with the metallized base contact 19a on the isolation region 18a.

The second prior art example described with reference to FIG. 2 has been improved in many respects as compared with the semiconductor device shown in FIG. 1, but it still has the following three defects. A first defect is that the base resistance is increased and the overall size of the base region is also increased because the active base region 16 is interposed between the graft base region 15 and the emitter region 17. A second defect is that as compared with the construction in which a metallized contact or electrode is formed on the graft base region 15, the resistance becomes high because the polysilicon layer 20 is extended so as to be used as an electrode. More particularly, the resistance of poylsilicon is higher than that of a metallization layer by a few orders of magnitude. Obviously, the increase in base resistance is contradictory to the recent trend toward the decrease in capacitance and resistance of various elements resulting from the ever increasing integration. A third defect resides in the fact that the isolation region 18b is deep; that is, the same problem as described with reference to FIG. 1.

Figure 3:
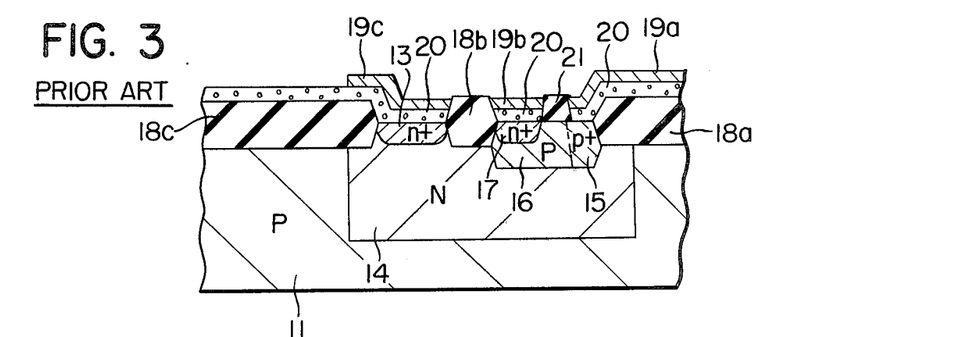

In FIG. 3 is shown a triple diffusion type bipolar semiconductor device having a higher integration density. The arrangement of the active base region 16, the emitter region 17 and the graft base region 15 is similar to that of the semiconductor device shown in FIG. 2. Thus the semiconductor device shown in FIG. 3 has advantages similar to those previously described. In addition, the metallized base contact 19a is formed directly on the surface of the polysilicon layer 20 on the graft base region 15, so that the base resistance is low.

However, this semiconductor device still has the following three defects. Its first and second defects are same as those described previously. A third defect is common among the triple diffusion type semiconductor devices and is that it is not formed or implanted with an n+-type region (that is, a heavily doped N-type region) which serves to decrease the collector resistance.

As described above, the prior art bipolar semiconductor devices have some defects as described above.

DESCRIPTION OF THE PREFERRED EMBODIMENTS

Figure 4:
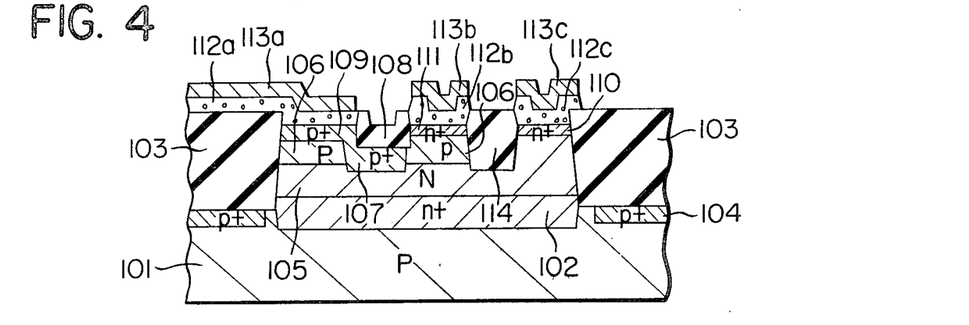
FIG. 4 shows a sectional view of an embodiment of a bipolar semiconductor device in accordance with the present invention.

In FIG. 4 is shown in cross section of a bipolar transistor or semiconductor device. Reference numeral 101 is a wafer of P-type silicon semiconductor; 102, an n+-type diffused region which serves to decrease the collector resistance; 103, isolation regions between elements; 104, a p+-type channel stopper; 105, an N-type epitaxial layer which has a resistance of from 0.5 to 5 $\Omega$cm and is 2 to 5 $\mu$m in thickness and serves as a collector; 106, an active base region with a P-type impurity concentration of the order of $1 \times 10^{17}$/cm$^3$; 107, a graft base region; that is, an external base region with a high concentration which is formed immediately below an isolation area or region 108 which isolates between the base and emitter; 109, a graft base region which is contiguous with the graft base region 108 and is formed below a base contact; 110, an n+-type diffused region formed for decreasing the contact resistance of the collector region 105, the region 110 being formed simultaneously with an emitter region 111; 112a, 112b and 112c, polysilicon layers which serve to prevent the formation of alloy pits in aluminum base, emitter and collector electrodes or contacts 113a, 113b and 113c, the polysilicon layers 112b and 112c further serving as the diffusion sources for the emitter region 111 and the collector contact region 110; and 114, an isolation region between the emitter region 111 and the collector region 105.

The peripheral surfaces of the emitter region 111 are surrounded by the isolation regions 108 and 114. As a result, the capacitance between the emitter and base can be made remarkably low and subsequently faster operations can be ensured. The graft base region 107 is formed immediately below the isolation region 108 and when viewed from the top its surface is very close to the emitter region 111; that is, the graft base region 107 and the emitter region 111 are very closely spaced apart from each other in the vertical direction. As a result, the base resistance is satisfactorily low. Since the emitter and graft base regions are completely isolated from each other, the problems of leakage current, burst noise and degradation in breakdown voltage all resulting from the direct contact between the emitter and graft base regions can be avoided. In addition, topographically the emitter and graft base regions are very close to each other. Thus the space for each element can be considerably reduced.

As to the burst noise, the semiconductor device of the type shown in FIG. 1 generates burst noise more than 100 times per minute. According to the present invention, the distance between the graft base and emitter regions can be set to from 0.2 to 0.3 μm. With this distance, burst noise is generated from 0 to one time per three minutes. Thus a remarkable improvement is evident.

As compared with the isolation region 103, the isolation region 114 which isolates between the emitter region 111 and the collector region 105 is shallow in depth so that the width of the isolation region 114 can be drastically shortened. Thus the first embodiment provides the construction which is ideal for further increasing the integration density.

The polysilicon layer 112 previously determines the positions of the emitter, collector and base electrodes or contacts. In other words, their positions can be determined without the step for forming contact windows. Furthermore, the emitter region 111, the collector region 105 and the base region 109 are all surrounded with the oxide layers and only the polysilicon layers which are needed for electrical contacts are exposed. As a result, some error in mask alignment can be tolerated.

Figure 5:
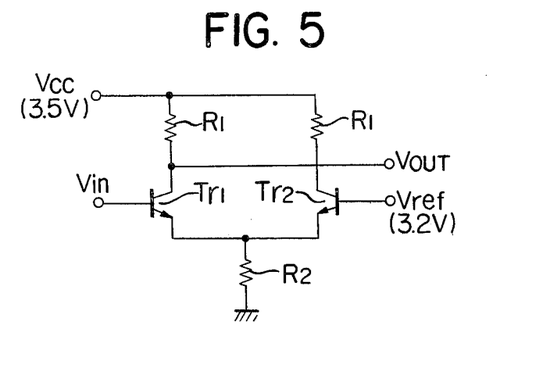
FIG. 5 shows a circuit diagram of an ECL gate used for the evaluation of the power consumption-delay time characteristics of the prior art bipolar semiconductor devices and those of the present invention.

Next the power consumption-time delay characteristic of the first embodiment; that is, the bipolar transistor shown in FIG. 4 will be described in comparison with that of the prior art semiconductor device of the type shown in FIG. 2. Both the transistors shown in FIGS. 2 and 4 were designed based upon a 4 μm rule. The graft base region 15 or 109 had 50 Ω/□; the active base 16 or 106 had 500Ω/□; the emitter region 17 or 111 was 0.2 μm in depth; and the active base region 16 or 106 was 0.4 μm in depth. Under these design conditions, the calculations showed that the prior art transistor had the base resistance of 300Ω while the transistor of the present invention had 150Ω. An ECL (emitter-coupled logic) gate as shown in FIG. 5 was used to obtain the power consumption versus delay time characteristics of the transistors. In FIG. 5, $Tr_1$ and $Tr_2$ are bipolar transistors; $V_{cc}$, a power supply terminal which is impressed with 3.5 V; $V_{ref}$, a reference voltage terminal impressed with 3.2 V; $V_{in}$, an input terminal; and $V_{out}$, an output terminal. $R_1$ and $R_2$ are resistors whose ratio is 1:4. The power consumption of the ECL gate can be varied by changing the values of the resistors $R_1$ and $R_2$.

Figure 6:
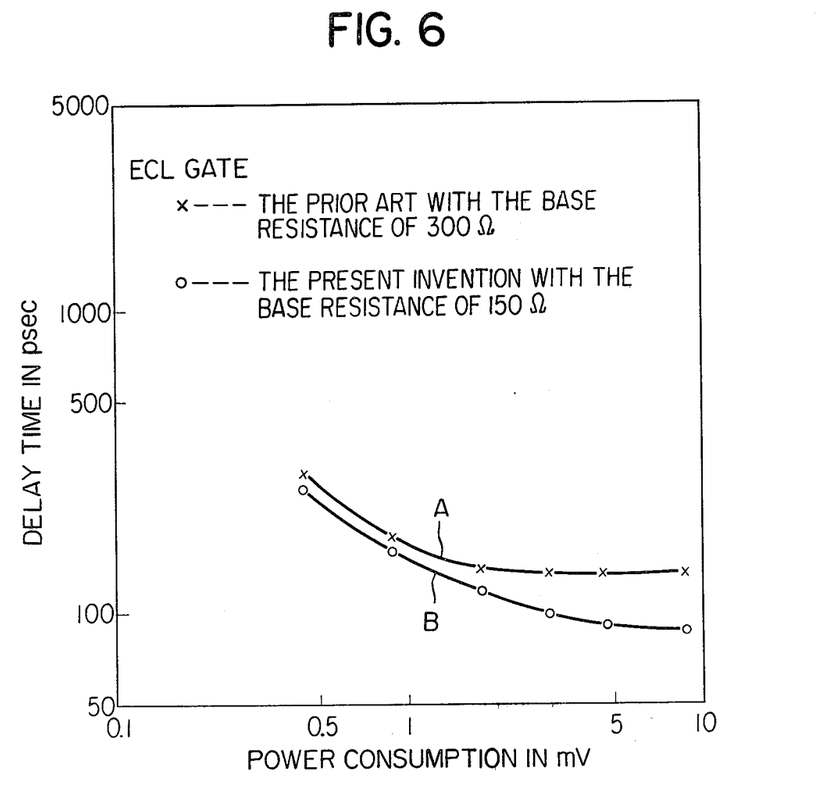
FIG. 6 shows the power consumption-time delay characteristic curves of the prior art bipolar semiconductor devices and of the present invention.

The results of experiments are shown in FIG. 6. The curve A shows the characteristic of the prior art transistor while the curve B, that of the transistor of the present invention when the transistors, which were designed and constructed under the previously described conditions, were inserted as the transistors $Tr_1$ and $Tr_2$ in the ECL gate shown in FIG. 5. It is obvious that the delay time of the transistor of the present invention is by far shorter than that of the prior art transistor. For instance, when $R_1$ is equal to 250Ω and $R_2$ is equal to 1kΩ(that is, when the power consumption is 88 mW), the prior art transistor's delay time is 133 psec while the present invention's delay time is 88 psec. Thus it is obvious that the transistor of the present invention is by far faster in operation than the prior art transistor.

Referring to FIGS. 7A to 7I, a first example of the method for fabrication of bipolar transistor devices in accordance with the present invention will be described step by step.

Figure 7A:
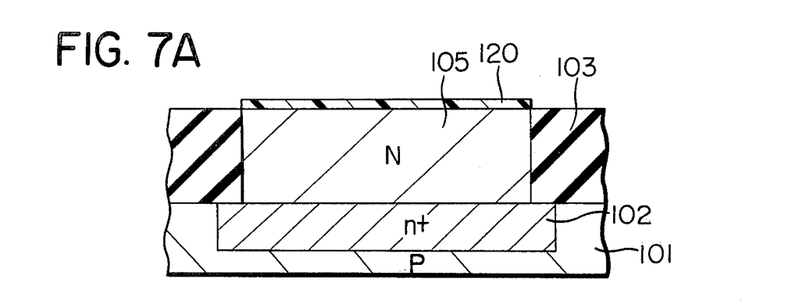
FIGS. 7A to 7I show a first example of the processes for fabricating the bipolar semiconductor devices in accordance with the present invention.

Step A:

An $n^+$-type island 102 is formed in a wafer 101 of P-type silicon semiconductor and the epitaxial region 105 which serves as a collector and the isolation regions 103 are formed over the wafer 101. The island 105 consists of an N-type single crystal with a specific resistivity of 0.6 to 2 Ωcm. A $Si_3N_4$ layer 120 for selective oxidization is formed over the island 105 by the conventional process.

Figure 7B:
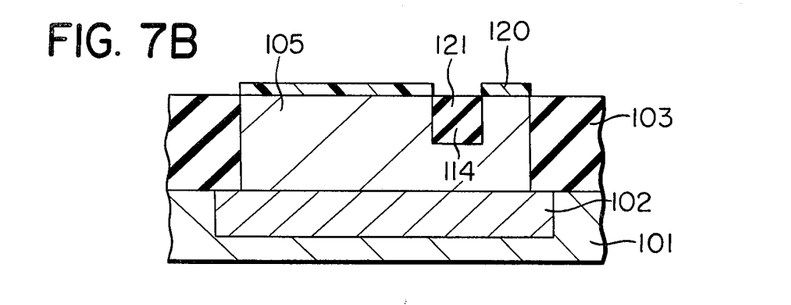

Step B:

The area of the $Si_3N_4$ layer 120 over the region 121 which isolates between the collector and base is removed and selective oxidization is carried out with the remaining $Si_3N_3$ layer used as a mask, whereby, the oxide region 114 which isolates between the base and collector is formed. This region 114 is referred to as the "BC isolation film" in this specification. The depth of the BC isolation film 114 is shallower than that of the oxide isolation film 103, so that the lateral extension of the oxide film may be minimized. Prior to the selective oxidization, the area of the island 105 corresponding to the BC isolation region 121 may be etched.

Figure 7C:
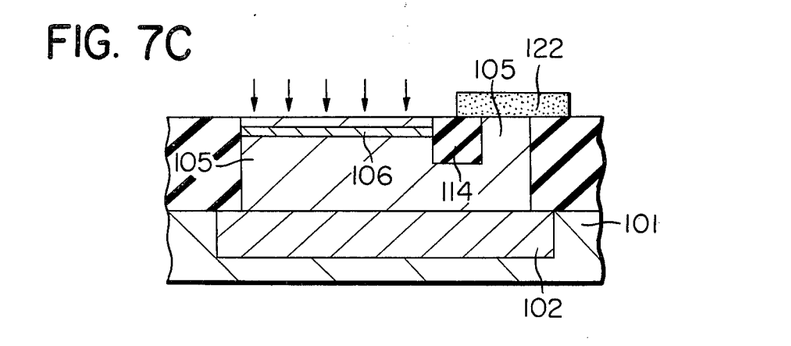

Step C:

By a conventional process, a photoresist film 122 is formed over the collector region 105 in order to prevent the implantation of ions into the region 105' in the collector region 105. When boron ions are implanted into the island 105, the resist film 128, the BC isolation film 114 and the isolation region 103 are used as a mask. The ion implantation results in the P-type active base region 106. When the ion implantation is carried out at 60 KeV and at the rate of $0.5 - 3 \times 10^{3}$ atoms/cm$^3$, the impurities are distributed to the depth of from 0.2 to 0.3 μm from the surface of the island 105. Adverse effects on Si of the ion implantation can be avoided or minimized by decreasing the dose as described above. As a result, the leakage current between the collector and emitter can be minimized and the yield can be improved.

Figure 7D:
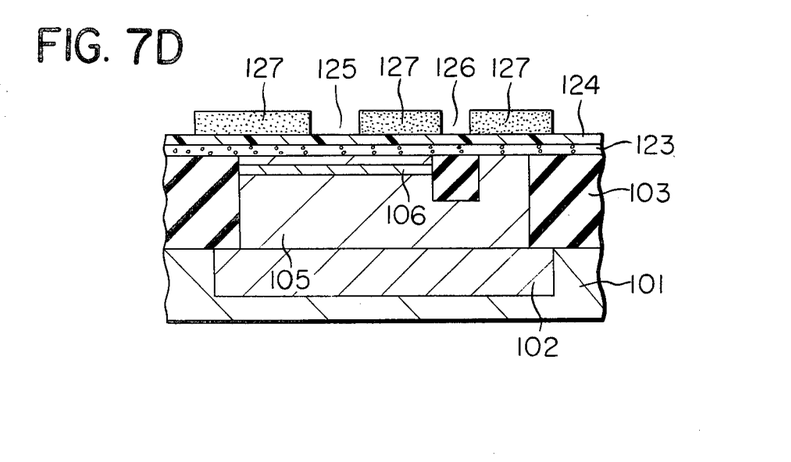

Step D:

After the resist film 122 is removed, the polysilicon layer 123 and the $Si_3N_4$ layer 124 are formed over the whole surface. Next a resist film 127 is formed so as to define windows for forming the isolation region 126 for isolating between the base and emitter and the isolation region 126 for isolating between the base and collector.

Figure 7E:
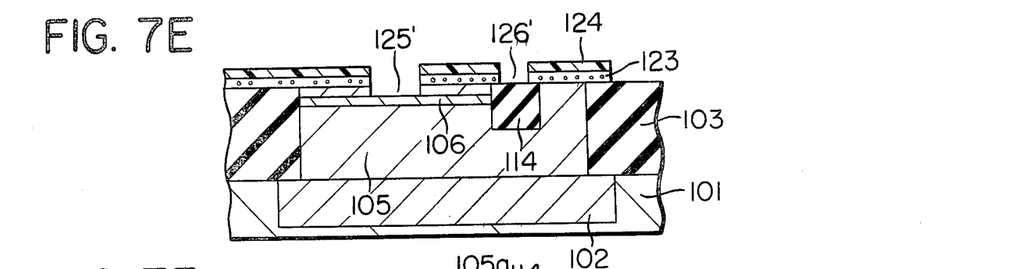

Step E:

Using as a mask the resist film 127 with apertures 125 and 126, the $Si_3N_4$ layer 124 and the polysilicon layer 123 are selectively etched, whereby the areas 125' and 126' are etched. In this case, the underlying single crystal silicon region 105 is so etched that the side surfaces of the region which serves as the emitter may be exposed. In other words, the active base region 106 must be exposed. Thereafter, the resist film 127 is removed.

Figure 7F:
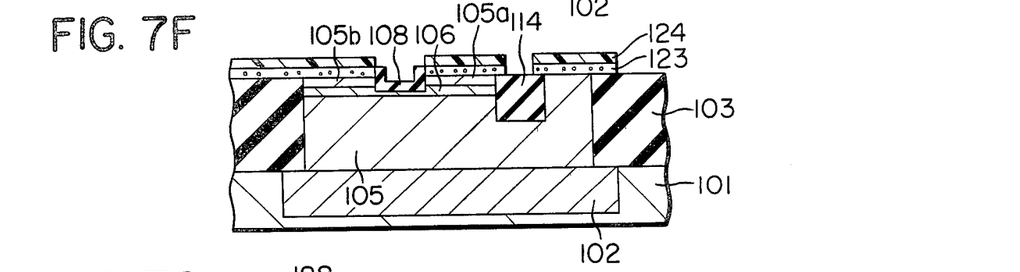

Step F:

Using as a mask the $Si_3N_4$ film 124, selective oxidization is carried out so that an oxide film 108 (to be referred to as the "EB isolation film" in this specification)

for isolating the region 105a which forms the emitter and the region 105b which forms a base contact is formed. The side surfaces of the region 105a which forms the emitter are covered with the EB isolation film 108.

Figure 7G:
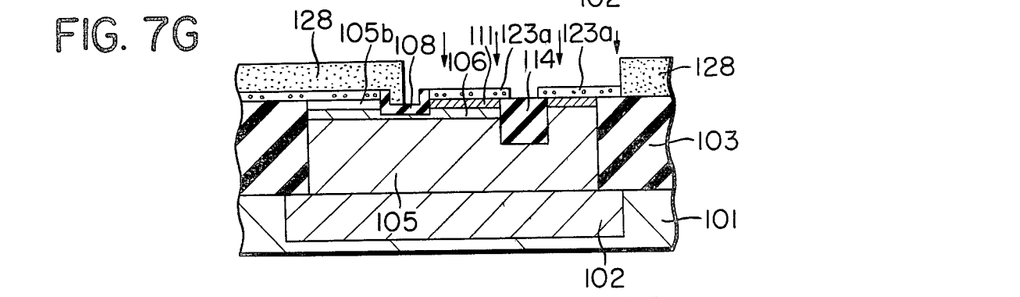

Step G:

The $Si_3N_4$ film 124 is removed and then a photoresist film 128 is formed on the region 105b which forms the base contact. Using as a mask the resist film 128, As ions are implanted in the polysilicon layer 123a. Thereafter, the wafer is subjected to a heat-treatment so that the $n^+$-type emitter 111 and the collector contact 110 are formed. The side surfaces of the emitter 111 are surrounded with the BC isolation film 114 and the EB isolation film 108.

Figure 7H:
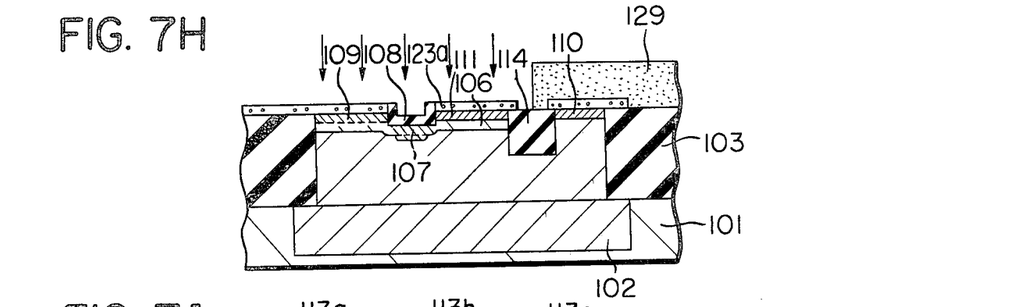

Step H:

The resist film 128 is removed and then a resist film 129 is formed at least on the collector contact region 110. Thereafter, boron ions are heavily implanted so that the high-concentration $p^+$-type graft bases 107 and 109 are formed. The graft bases 107 and 109 are self-aligned with respect to the emitter 111. Boron ions are also injected into the emitter 111, but the polysilicon layer 123a is formed over it, so that the penetration of ions into the active base 106 immediately below the emitter 111 can be avoided by suitably selecting the energy level for ion implantation. The graft bases 107 and 109 are extended very close to the emitter 111, so that the base resistance can be lowered. The boron ions are implanted at a high density or concentration after the areas adjacent to the emitter 111 have been oxidized, so that no boron ion can penetrate into the layer 106 immediately below the BC isolation film 114 and the EB isolation film 108. For instance when the thickness of the BC and EB isolation films 114 and 108 are selected from 0.2 to 0.4 μm, the emitter 111 and the graft base 107 can be separated from each other in the ion implantation step. The boron ion implantation at a high concentration is carried out after the emitter 111 and the active base 106 have been formed, so that a heat-treatment step at high temperatures may be eliminated. As a result, the distribution of impurities remains unchanged until the final step is accomplished. Especially the penetration into the layer 106 immediately below the emitter 111 can be avoided. As a result, a high breakdown voltage between the emitter 111 and the active base 106 can be maintained. In addition, burst noise as well as the leakage current between the collector and emitter can be suppressed.

Figure 7I:
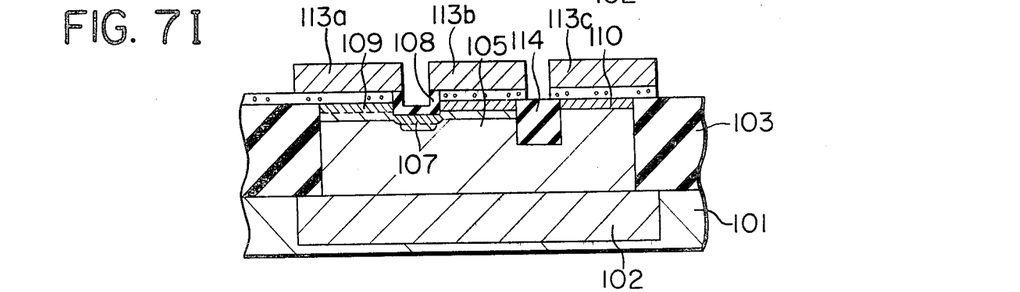

Step I:

Contact regions are metallized with aluminum evaporation so that the base contact 113a, the emitter contact or electrode 113b and the collector electrode or contact 113c are formed. Each conduction structure consists of the aluminum metallization, the polysilicon layer and the single crystal silicon layer, so that even when the wafer is subjected to a sintering process, breakdowns of contacts due to the penetration of aluminum can be avoided.

The active base region can be formed by the ion implantation prior to the ion implantation into the graft base (See FIG. 7H). Obviously the same effects can be obtained.

Referring next to FIGS. 8A to 8F, a second example of the process for fabricating the bipolar semiconductor devices in accordance with the present invention will be described in detail. The second process is simpler than the first process or method described previously with reference to FIGS. 7A to 7I.

Figure 8A:
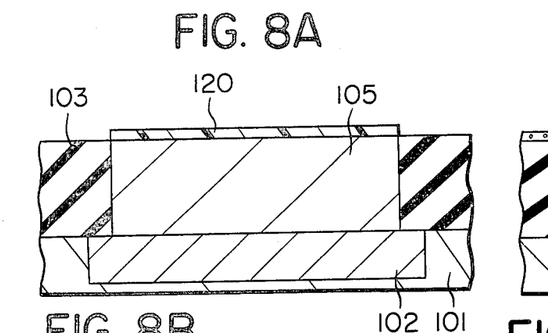
FIGS. 8A to 8F also show a second example of the process for fabricating the bipolar semiconductor devices in accordance with the present invention.

Step A:

The $n^+$-type island 102 is formed in the wafer 101 and the isolation region 103 and the island 105 are formed on the wafer 101. The island consists of an N-type single crystal with a specific resistivity of from 0.6 to 2 Ωcm. The $Si_3N_4$ layer 20 is formed on the island 105 for selective oxidization by a conventional process.

Figures 8B, 8F:
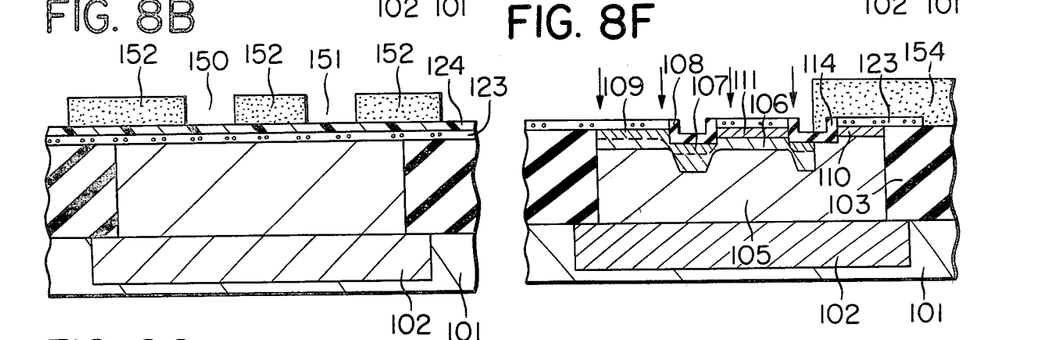

Step B:

The polysilicon layer 123 is formed and then the $Si_3N_4$ layer 124 is formed over the layer 123. A resist film 152 with apertures 150 and 151 for defining the region for isolating between the base and emitter and the region for isolating the base and collector is formed over the layer 124.

Figure 8C:
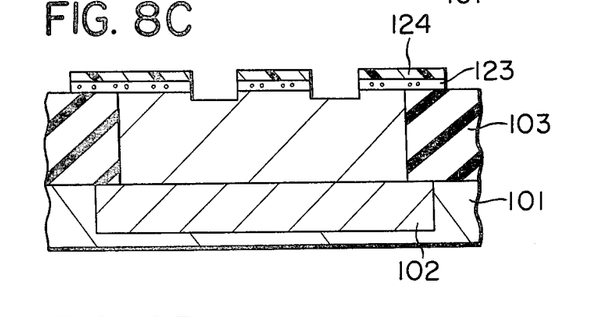

Step C:

The areas of the silicon nitride layer 124, the polysilicon layer 123 and the island 105 exposed through the apertures 150 and 151 of the resist layer 152 are etched or removed. Etching is carried out in such a way that the side surfaces of an area of the island 105 which will be converted into the emitter are sufficiently exposed. Thereafter, the resist film 152 is removed.

Figure 8D:
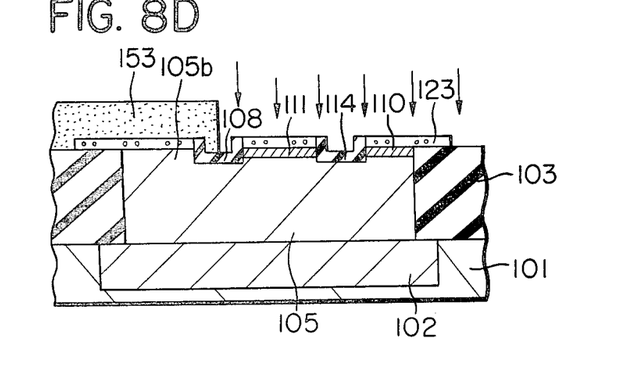

Step D:

Selective oxidization is carried out with the $Si_3N_4$ film 124 being used as a mask. The EB isolation film 114 and the BC isolation film 108 are formed. Next, a resist film 153 is formed over the region 105b which forms the base contact and As ions are implanted in such a way that the implanted ions may be most concentrated adjacent to the surface of the polysilicon layer 123. Thereafter, the wafer is subjected to a heat-treatment step, so that the $n^+$-type emitter 111 and the collector contact 110 are formed. The side surfaces of the emitter 111 are surrounded with the EB and BC isolation films 108 and 114.

Figure 8E:
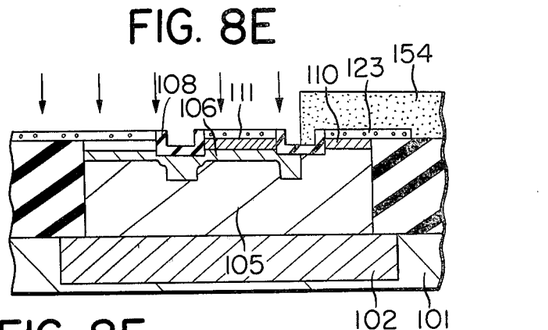

Step E:

A resist film 154 is formed over the collector contact 110 and boron ions are implanted to form the active base 106. It is possible to have the boron ions penetrate through the emitter 111 into the active base 106 immediately below it by imparting high energies to the boron ions.

Step F:

Using the resist film 154 still as a mask, the boron ions are implanted at a higher concentration, so the $p^+$-type (heavily doped) graft bases 107 and 109 are formed. The penetration into the active base 106 immediately below the emitter 111 can be avoided by suitably selecting the level of energy imparted to the boron ions. As with the case of the first example described previously in conjunction with FIGS. 7A to 7I, the graft base 107 is formed very closely to the emitter 111 so that the base resistance can be lowered.

The steps succeeding to the Step F are similar to those described previously with reference to FIGS. 7A to 7I.

It is to be understood that both the processes described with reference to FIGS. 7A to 8F can eliminate the step of forming the polysilicon layer. In this case, the conduction structure consists of the aluminum metallization and the single crystal silicon layer. As a result, the contact breakdowns due to the penetration by aluminum in a sintering step must be taken into account. This problem may be solved by increasing the depth of the emitter 111.

In a third example of the fabrication process, the polysilicon layer is formed prior to the step A and then the selective oxidization mask is formed so as to form the isolation films. The succeeding steps are similar to those described previously with reference to FIGS. 7A to 7I.

In a fourth example of the fabrication processes, the polysilicon layer is formed after the base and collector have been isolated. The effects similar to those attained by the first example (FIGS. 7A to 7I) can be attained.

What is claimed is:

1. A semiconductor integrated circuit device comprising:

a bipolar transistor in which contiguous active and external base regions and an emitter region are formed in a semiconductor island, said active base region being disposed immediatly below said emitter region, said island forming a collector region isolated from another element by a first isolation region comprising insulating material;

side surfaces of a conduction path of said external base region being surrounded by said first isolation region and a second isolation region comprising insulating material formed in said island; said second isolation region and a third isolation region formed in said island cooperating with each other to surround the side walls of said emitter region;

the junction between said emitter region and said active base region terminating against said second isolation region and said third isolation region at locations above the bottom of said second isolation region and said third isolation region;

side surfaces of a conduction path of said collector region being surrounded by said first isolation region and isolated from said emitter region by said third isolation region formed in said island;

said external base region extending from immediately below said second isolation region and being isolated from said emitter region by said second isolation region.

2. A semiconductor integrated circuit device as set forth in claim 1 further characterized in that the depth of each of said second and third insulation or isolation regions is shallower than that of said first insulation or isolation region.

3. A semiconductor integrated circuit device as set forth in claim 1 further characterized in that part of said external base region is vertically isolated from said emitter and is extended very closely to the area immediately below one side of said emitter.

4. A semiconductor integrated circuit device as set forth in claim 1 further characterized in that the side surfaces of said emitter is surrounded with said second and third insulation or isolation regions.

5. A semiconductor integrated circuit device as set forth in claim 1 further characterized in that a polycrystal semiconductor layer is formed over the emitter and an emitter electrode or contact is formed over said polycrystal semiconductor layer.

6. A semiconductor integrated circuit device as set forth in claim 1 further characterized in that an island is formed on a diffused or implanted collector region formed on or in a semiconductor wafer.

7. A semiconductor integrated circuit device as set forth in claim 1 further characterized in that said first, second and third insulation or isolation regions consist of an oxide.

* * * * *